(12) United States Patent
Meyer-Berg et al.

(10) Patent No.: US 9,190,389 B2
(45) Date of Patent: Nov. 17, 2015

(54) CHIP PACKAGE WITH PASSIVES

(71) Applicant: Infineon Technologies AG, Neubiberg (DE)

(72) Inventors: Georg Meyer-Berg, Munich (DE); Joachim Mahler, Regensburg (DE); Khalil Hosseini, Weihmichl (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/951,554

(22) Filed: Jul. 26, 2013

(65) Prior Publication Data

US 2015/0028487 A1  Jan. 29, 2015

(51) Int. Cl.

| | | |
|---|---|---|
| H01L 23/02 | (2006.01) | |
| H01L 25/04 | (2014.01) | |
| H01L 23/00 | (2006.01) | |
| H01L 23/498 | (2006.01) | |
| H01L 25/16 | (2006.01) | |
| H01L 23/538 | (2006.01) | |

(52) U.S. Cl.
CPC .......... *H01L 25/04* (2013.01); *H01L 23/49861* (2013.01); *H01L 24/24* (2013.01); *H01L 24/82* (2013.01); *H01L 25/16* (2013.01); *H01L 23/5389* (2013.01); *H01L 2224/04105* (2013.01); *H01L 2224/24137* (2013.01); *H01L 2224/24246* (2013.01); *H01L 2224/32245* (2013.01); *H01L 2224/73267* (2013.01); *H01L 2924/1305* (2013.01); *H01L 2924/13055* (2013.01); *H01L 2924/13091* (2013.01); *H01L 2924/15787* (2013.01); *H01L 2924/19041* (2013.01); *H01L 2924/19043* (2013.01)

(58) Field of Classification Search
CPC ................................ H01L 21/56; H01L 25/04
USPC .......................................................... 257/686
See application file for complete search history.

(56) References Cited

U.S. PATENT DOCUMENTS

| | | | |
|---|---|---|---|
| 5,608,261 | A | 3/1997 | Bhattacharyya et al. |
| 5,668,406 | A | 9/1997 | Egawa |
| 5,757,072 | A | 5/1998 | Gorowitz et al. |
| 6,333,856 | B1 | 12/2001 | Harju |
| 7,045,440 | B2 | 5/2006 | Huff et al. |
| 7,196,898 | B2 | 3/2007 | Osaka et al. |
| 7,312,518 | B2 | 12/2007 | Liao et al. |
| 7,319,049 | B2 | 1/2008 | Oi et al. |
| 7,385,296 | B2 | 6/2008 | Ohta |

(Continued)

FOREIGN PATENT DOCUMENTS

JP           11026279 A  *  1/1999

OTHER PUBLICATIONS

Ewe, H., et al. "Chip Package and Method for Manufacturing the Same." U.S. Appl. No. 13/803,108, filed Mar. 14, 2013.

*Primary Examiner* — Ajay K Arora
(74) *Attorney, Agent, or Firm* — Murphy, Bilak & Homiller, PLLC

(57) ABSTRACT

A chip package device includes an electrically conducting chip carrier, at least one semiconductor chip attached to the electrically conducting chip carrier, and an insulating laminate structure embedding the chip carrier, the at least one semiconductor chip and a passive electronic device. The passive electronic device includes a first structured electrically conducting layer, the first structured electrically conducting layer extending over a surface of the laminate structure.

11 Claims, 10 Drawing Sheets

(56) References Cited

U.S. PATENT DOCUMENTS

| | | |
|---|---|---|
| 7,446,262 B2 | 11/2008 | Ogawa et al. |
| 7,488,897 B2 | 2/2009 | Ogawa et al. |
| 7,750,247 B2 | 7/2010 | Chikagawa et al. |
| 7,929,316 B2 | 4/2011 | Noda et al. |
| 8,068,347 B2 | 11/2011 | Choi et al. |
| 8,164,171 B2 | 4/2012 | Lin et al. |
| 8,187,920 B2 | 5/2012 | Mohan et al. |
| 8,455,300 B2 | 6/2013 | Chi et al. |
| 8,742,579 B2 | 6/2014 | Pagaila et al. |
| 8,754,514 B2 | 6/2014 | Yu et al. |
| 8,822,266 B2 | 9/2014 | Smeys et al. |
| 2005/0230848 A1 | 10/2005 | Nakatani et al. |
| 2006/0038289 A1* | 2/2006 | Hsu et al. ........... 257/734 |
| 2006/0157832 A1 | 7/2006 | Ryu et al. |
| 2006/0191711 A1 | 8/2006 | Cho et al. |
| 2007/0025092 A1 | 2/2007 | Lee et al. |
| 2009/0072388 A1* | 3/2009 | Tews et al. ........... 257/724 |
| 2009/0115047 A1 | 5/2009 | Haba et al. |
| 2009/0236647 A1* | 9/2009 | Barth et al. ........... 257/296 |
| 2010/0127386 A1* | 5/2010 | Meyer-Berg ........... 257/698 |
| 2011/0108971 A1* | 5/2011 | Ewe et al. ........... 257/686 |
| 2011/0127675 A1 | 6/2011 | Ewe et al. |
| 2013/0010446 A1 | 1/2013 | Henrik et al. |

\* cited by examiner

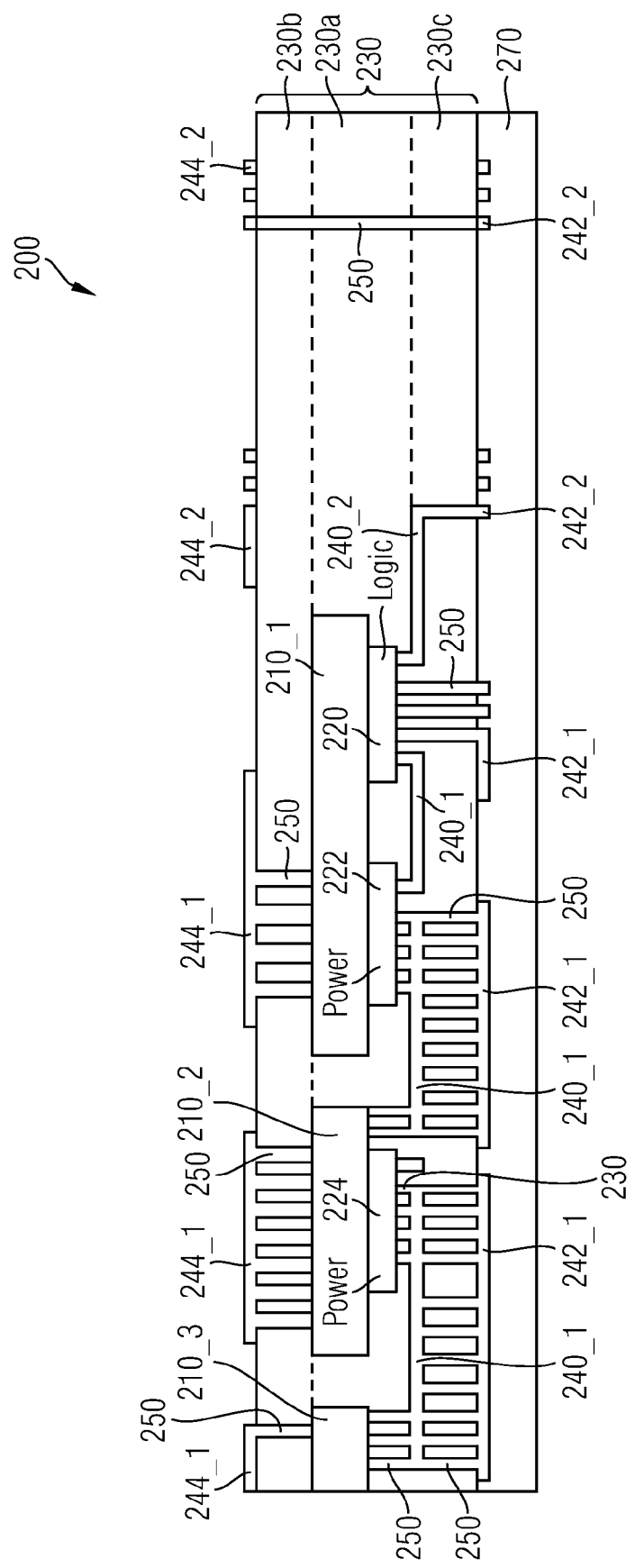

US 9,190,389 B2

CHIP PACKAGE WITH PASSIVES

TECHNICAL FIELD

The invention relates to the technique of semiconductor chip packaging, and more particularly to semiconductor chip packages with passives.

BACKGROUND

The necessity to provide smaller, thinner, lighter, cheaper electronic systems with reduced power consumption, more diverse functionality and improved reliability has driven a stream of technological innovations in all technical fields involved. This is also true for the areas of assembly and packaging providing protective environment for miniaturized electronic systems and allowing for a high degree of reliability.

SUMMARY

According to an embodiment of a chip package, the chip package comprises an electrically conducting chip carrier, at least one semiconductor chip attached to the electrically conducting chip carrier, and an insulating laminate structure embedding the electrically conducting chip carrier and the at least one semiconductor chip. The chip package further comprises a passive electronic device comprising a first structured electrically conducting layer, the first structured electrically conducting layer extending over a surface of the laminate structure.

According to another embodiment of a chip package, the chip package comprises an electrically conducting chip carrier, at least one semiconductor chip attached to the electrically conducting chip carrier, an insulating layer extending over the electrically conducting chip carrier, and a passive electronic device comprising a first structured electrically conducting layer. The first structured electrically conducting layer extends over the insulating layer. The package further comprises an insulating laminate structure embedding the electrically conducting chip carrier, the at least one semiconductor chip, and the passive electronic device.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

Reference numerals in different figures which only differ in the leading digit may refer to similar or identical parts except where the context indicates otherwise. Reference numerals to which a suffix "_n" is added refer to a particular element of the referenced part.

FIG. 2A schematically illustrates a cross-sectional view of an embodiment of a chip package comprising two coils.

DETAILED DESCRIPTION

Figure 1A:
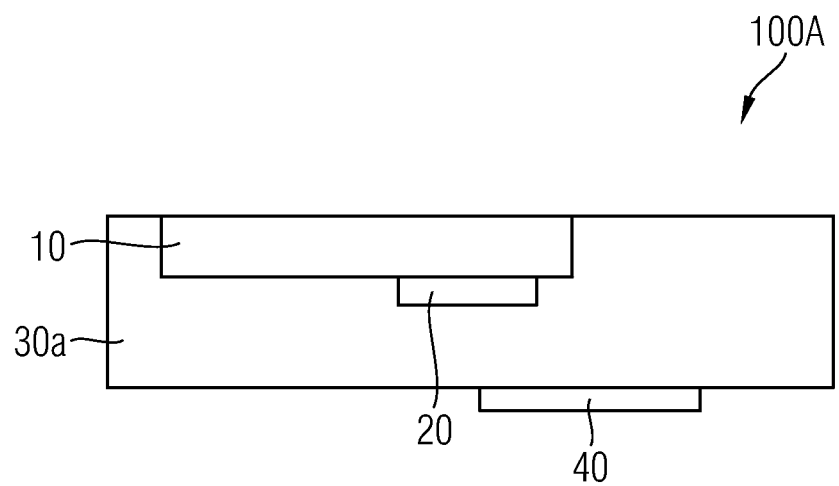
FIG. 1A schematically illustrates a cross-sectional view of one embodiment of a chip package comprising a chip carrier, a semiconductor chip, an insulating laminate structure and a passive electronic device.

Aspects and embodiments are now described with reference to the drawings. In the following description, for purposes of explanation, numerous specific details are set forth in order to provide a thorough understanding of one or more aspects of the embodiments. It is to be understood that other embodiments may be utilized and structural or logical changes may be made without departing from the scope of the present invention. It should be noted further that the drawings are not to scale or not necessarily to scale.

In the following detailed description, reference is made to the accompanying drawings, which form a part thereof, and in which is shown byway of illustration specific embodiments in which the invention may be practiced. It may be evident, however, to one skilled in the art that one or more aspects of the embodiments may be practiced with a lesser degree of the specific details.

Directional terminology, such as "top", "bottom", "left", "right", "upper", "lower", "front", "back", "leading" etc., is used with reference to the orientation of the figure(s) described herein. Because embodiments can be positioned in different orientations, the directional terminology is used only for purposes of illustration and is in no way limiting. Further, it is to be understood that other embodiments may be utilized and structural or logical changes may be made without departing from the scope of the present invention. The following detailed description, therefore, is not to be taken in a limiting sense, and the scope of the present invention is defined by the appended claims.

In addition, while a particular feature or aspect of an embodiment may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". The term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

The semiconductor chip(s) described further below may be of different types, may be manufactured by different technologies and may include, for example, integrated electrical, electro-optical or electro-mechanical circuits and/or passives. The semiconductor chip(s) may, for example, be configured as power semiconductor chip(s), such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor chip(s) may include control circuits, microprocessors or microelectromechanical components. The semiconductor chip(s) need not be manufactured from specific semiconductor material, for example Si, SiC, SiGe, GaAs, and, furthermore, may contain inorganic and/or organic materials that are not semiconductors, such as insulators, plastics, or metals.

In particular, semiconductor chip(s) having a vertical structure may be involved, that is to say that the semiconductor chip(s) may be fabricated in such a way that electrical currents flows in a direction perpendicular to the main surfaces of the semiconductor chip(s). A semiconductor chip having a vertical structure may have contact pads in particular on its two main surfaces, that is to say on its bottom side and top side. In particular, power semiconductor chip(s) may have a vertical structure. By way of example, the source electrode and gate electrode of a power chip, e.g. power MOSFET chip may be situated on one main surface, while the drain electrode of the power chip is arranged on the other main surface.

Furthermore, the chip packages described herein may include logic integrated circuit chip(s) (logic chip(s)), which may control other semiconductor chips of the chip package. For example, the gate electrode of power semiconductor chip may be controlled by an electrical trace from a logic chip. In one embodiment the logic chip(s) may have a non-vertical structure comprising an active main surface with chip contact electrodes and a passive main surface with no chip contact electrodes.

The semiconductor chip(s) may have contact pads (or electrodes) which allow electrical contact to be made with the integrated circuits included in the semiconductor chip(s). The electrodes may be arranged all at only one main surface of a semiconductor chip or at both main surfaces of the semiconductor chip. They may include one or more electrode metal layers which are applied to the semiconductor material of a semiconductor chip. The electrode metal layers may be manufactured with any desired geometric shape and any desired material composition. For example, they may comprise or be made of a material selected of the group of Cu, Ni, NiSn, Au, Ag, Pt, Pd, an alloy of one or more of these metals, an electrically conducting organic material, or an electrically conducting semiconductor material.

One or more semiconductor chips may be mounted on a chip carrier and embedded in an insulating laminate structure. The insulating laminate structure may comprise at least one electrically insulating layer. The at least one electrically insulating layer may have the shape of a foil or sheet, which is laminated on top of the semiconductor chip(s) and the carrier. The electrically insulating layer may be made of a polymer material. In one embodiment, the electrically insulating layer may be made of a polymer material which is coated with a metal layer, e.g. a copper layer (so-called RCC (Resin Coated Copper) foil). Heat and pressure may be applied for a time suitable to attach the electrically insulating layer to the underlying structure. During lamination, the electrically insulating foil or sheet is capable of flowing (i.e. is in a plastic state), resulting in that gaps between the semiconductor chip(s) or other topological structures on the chip carrier or on other parts of, e.g., a leadframe of which the chip carrier may form a part of are filled with the polymer material of the electrically insulating foil or sheet.

The electrically insulating layer may be made of any appropriate duroplastic, thermoplastic or thermosetting material or laminate. In one embodiment, the electrically insulating layer may be made of a prepreg (short for preimpregnated fibers), that is made, e.g., of a combination of a fiber mat, for example glass or carbon fibers, and a resin, for example a duroplastic material. The duroplastic resin may, e.g., be made on the basis of an epoxy resin. Prepreg materials are known in the art and are typically used to manufacture PCBs (printed circuit boards). In another example, the electrically insulating layer may be made of a particle reinforced laminate resin layer. The particles may be made of the same materials as the fibers of a prepreg layer. In one example, the electrically insulating layer may be made of an unfilled laminate resin layer. As mentioned above, the resin may e.g. be a thermosetting resin. In still another example, the electrically insulating layer may be made of a thermoplastic material, which melts by application of pressure and heat during lamination and (reversibly) hardens upon cooling and pressure release. Laminate resin layers made of a thermoplastic material may also be unfilled, fiber reinforced or particle reinforced. The thermoplastic material may e.g. be one or more materials of the group of polyether-imide (PEI), polyether-sulfone (PES) polyphenylene-sulfide (PPS) or polyamide-imide (PAI).

The chip package comprises a passive electronic device. An electrically conducting layer may be applied to a surface of the electrically insulating layer of the insulating laminate structure in order to form at least a part of the passive electronic device. The electrically conducting layer may, e.g., be a metal layer. The electrically conducting layer may be applied to the electrically insulating layer by using deposition processes, such as, e.g., chemical vapor deposition, physical vapor deposition, chemical and electrochemical techniques, e.g., sputtering, galvanic plating or electroless plating. In other embodiments, the electrically conducting layer, e.g. an electrically conducting foil, may be applied as a whole, e.g. by using a laminating technique. It should be appreciated that any such terms as "applied" or "deposited" are meant to cover literally all kinds and techniques of applying layers onto each other.

The electrically conducting layer may be structured to provide a structured electrically conducting layer which forms a part of the passive electronic device. Various techniques of generating a structured electrically conducting layer may be used. By way of example, the structured electrically conducting layer may be generated by (partial) etching. Depending on the electrically conducting material various etchants may be used, among them e.g. copper chloride, iron chloride, HF, NaOH, $HNO_3$, $K_3Fe(CN)_6$ and KI. Etching may be accomplished by using a mask for masking the regions of the electrically conducting layer which are not to be etched. The mask may be an applied structured organic mask layer on the electrically conducting layer. The structured organic mask layer may be applied by printing techniques, such as stencil printing, screen printing or ink jet printing. In another examples, a continuous layer of an organic material, e.g., a photoresist may be applied to the electrically conducting layer and subsequently structured, e.g., by photolithography to produce the structured organic mask layer. For instance spin coating may be used to apply the continuous layer of organic material. In other examples, the structured electrically conducting layer may be generated by material machining techniques such as e.g. milling or stamping.

The structured electrically conducting layer of the passive electronic device may be electrically coupled by a through-connection to another electrically conducting element such as, e.g., the chip carrier, a contact pad of the semiconductor chip or another electrically conducting layer of the passive electronic device. The electrical coupling may be established by generating at least one vertical interconnection access (via). The at least one via may comprise an opening and an electrically conducting material filling the opening. The opening may pass vertically through the at least one electrically insulating layer in a way that a section of the other electrically conducting element is laid open. The opening may be generated, for example, by conventional drilling, laser drilling, chemical etching, or any appropriate method. Filling of the opening with an electrically conducting material may be performed, e.g., by chemical vapor deposition, physical vapor deposition, chemical and electrochemical techniques, or any other appropriate technique.

The electrically conducting chip carrier on which the semiconductor chip (s) are mounted forms apart of the chip package. By way of example, the electrically conducting chip carrier may form a part of a leadframe. The semiconductor chip (s) may be mounted on this part of the leadframe. The electrically insulating layer of the insulating laminate structure may be laminated onto the leadframe and the semiconductor chip(s) mounted thereon to form a build-up laminate structure which covers and embeds the semiconductor chip(s).

By way of example, the electrically conducting chip carrier may, e.g., be a PCB (printed circuit board). The PCB may have at least one PCB insulating layer and a structured PCB metal foil layer attached to the insulating layer. The PCB insulating layer is typically made on the basis of epoxy resin, polythetrafluoroethylene, aramid fibers or carbon fibers and may include reinforcement means such as fiber mats, for example glass or carbon fibers. The semiconductor chip(s) are mounted on the structured PCB metal foil layer. Thus, after lamination of the electrically insulating layer, the chip package may virtually be a multi-layer PCB with one or more bare chips integrated therein.

By way of example, the electrically conducting chip carrier may comprise a plate of ceramics or a plate of ceramics coated with a metal layer. For instance, such carrier may be a DCB (direct copper bonded) ceramics substrate.

The semiconductor chip(s) are bonded onto the electrically conducting chip carrier via a bond layer. In one embodiment, the bond layer is made of solder, e.g. soft solder, hard solder or diffusion solder. If diffusion soldering is used as a connecting technique, solder materials are used which lead to intermetallic phases after the end of the soldering operation at the interfaces between the electrode pads of the semiconductor chip(s), the diffusion solder bond layer and the chip carrier on account of interface diffusion processes. Byway of example, solder materials such as, e.g., AuSn, AgSn, CuSn, AgIn, AuIn, CuIn, AuSi, Sn, or Au may be used.

Further, the semiconductor chip(s) may be bonded to the chip carrier by using an electrically conductive adhesive which may be based on epoxy resins or other polymer materials and be enriched with e.g. gold, silver, nickel or copper particles in order to provide for the electrical conductivity. It is also possible to prepare such a layer containing electrically interconnecting particles by either applying so-called nano pastes or by directly depositing metal particles and by performing then a sintering process to produce a sintered metal particle layer.

The chip package comprises a passive electronic device. A first structured electrically conducting layer forms at least a part of the electronic device. The structured electrically conducting layer may, e.g., form a coil, a capacitor plate, a resistive layer, etc. It may further comprise conducting traces, leads or pads.

More specifically, the passive electronic device may be an inductor. The inductor may comprise a coil which may be generated by spiralic-like traces or leads of the structured electrically conducting layer. The inductance of the inductor may e.g. be defined by the number of windings, by the radius of the windings, by the lateral dimensions of the traces or leads, by the provision of a magnetic core of the coil and by the material composition of the insulating laminate structure.

Further, the passive electronic device may be a capacitor. The structured electrically conducting layer may form a first plate of the capacitor. A second plate of the capacitor may be provided by the electrically conducting chip carrier or by another part of a carrier (e.g. a leadframe) of which the chip carrier forms a part thereof. The capacity of the capacitor may be defined by the dimensions of the first plate and the second plate of the capacitor, by the distance between the first plate and the second plate, and by the dielectric layer or layer stack embedded between the first plate and the second plate of the capacitor.

Still further, the passive electronic device may be a resistor. The structured electrically conducting layer may form a resistive path of the resistor. The electrical resistance of the resistor may be configured, e.g., by the resistive material or resistive material compound being selected and by the dimensions of the resistive path.

FIG. 1A schematically illustrates a cross-sectional view of a chip package 100A. The chip package 100A includes an electrically conducting chip carrier 10. In one embodiment, as mentioned above, the chip carrier 10 may be a flat metal plate. The material of the metal plate may be copper, aluminium or any other suitable material. By way of example the chip carrier 10 may be a leadframe or a part thereof. In another embodiment, the chip carrier 10 may comprise or be made of plastic or a ceramic material coated with an electrically conducting layer such as, e.g., a metal foil.

At least one semiconductor chip 20 is mounted onto the electrically conducting chip carrier 10. The semiconductor chip 20 may be mounted onto the bottom side of the chip carrier 10. In another embodiment, the semiconductor chip 20 may be mounted onto the top side of the chip carrier 10. The semiconductor chip 20 may be of any type as mentioned above. The semiconductor chip 20 may have a vertical structure. By way of example, the semiconductor chip 20 may be a power chip. In another embodiment the semiconductor chip 20 may be a non-vertical device such as, e.g., a logic chip, with an active surface comprising contact pads to the chip and a passive surface electrically insulating the chip.

In one embodiment the semiconductor chip 20 may be attached to the chip carrier 10 via a bond layer (not shown). As mentioned above, the bond layer may be made of a diffusion solder, a conductive adhesive, a nanopaste containing metal particles, or metal particles deposited directly to the chip carrier. In one embodiment the bond layer may provide electrical coupling between the chip carrier 10 and the semiconductor chip 20. For instance, a contact pad, e.g. the drain electrode, of a power chip may be electrically coupled to the electrically conducting chip carrier 10. In another embodiment, the bond layer may not provide electrical coupling between the chip carrier 10 and the semiconductor chip 20. For instance, the passive surface of a non-vertical logic chip may be attached to the chip carrier 10.

As shown in FIG. 1A, an insulating laminate structure 30 embeds the chip carrier 10 and the semiconductor chip 20 being mounted thereon. The insulating laminate structure 30 may comprise at least one electrically insulating layer. The at least one electrically insulating layer may have the shape of a foil or sheet and may, e.g., be made of a polymer material. In one embodiment, as e.g. shown in FIG. 1A, the at least one electrically insulating layer of the insulting laminate structure 30 may be represented by a first electrically insulating layer 30a. The first electrically insulating layer 30a may be laminated onto the bottom side of the chip carrier 10 with the semiconductor chip 20 being mounted thereon. The first electrically insulating layer 30a may partly or completely cover one or all side walls and/or a main surface of the semiconductor chip 20 facing away from the chip carrier 10, and may partly or completely cover the bottom side of the chip carrier 10 at zones which are not covered by the semiconductor chip 20. A top side of the chip carrier 10 may, e.g., remain uncovered by the first electrically insulating layer 30a.

The chip package 100A further comprises a structured electrically conducting layer 40. The structured electrically conducting layer 40 may be applied to a surface of the insulating laminate structure 30, e.g. to the bottom surface thereof as illustrated in FIG. 1A.

The structured electrically conducting layer 40 may have a characteristic structure of a passive electronic device such as a coil, a capacitor, or a resistor. The structured electrically conducting layer 40 may extend in a plane which does not intersect with the chip carrier 10. Further, the structured electrically conducting layer 40 may extend in a plane which does not intersect with the semiconductor chip 20.

Figure 1B:
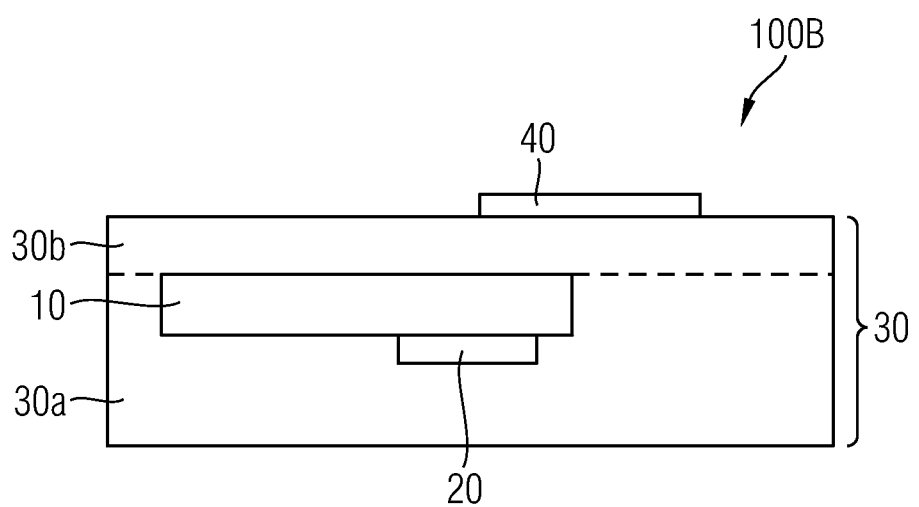
FIG. 1B schematically illustrates a cross-sectional view of one embodiment of a chip package comprising a chip carrier, a semiconductor chip, an insulating laminate structure and a passive electronic device.

In another embodiment, as shown in FIG. 1B, the structured electrically conducting layer 40 may be applied to the top side of the insulating laminate structure 30. By way of example, a second electrically insulating layer 30b of the insulating laminate structure 30 may be laminated onto the top side of the chip carrier 10. The second electrically insulating layer 30b may partly or completely cover the top side of the chip carrier 10. The structured electrically conducting layer 40 may be applied to a surface of the insulating laminate structure 30, e.g. to the top surface thereof as illustrated in FIG. 1A. By way of example, the structured electrically conducting layer 40 may be applied to the top surface of the second electrically insulating layer 30b.

In one embodiment as mentioned above, the insulating laminate structure 30 may include at least one through-connection (not shown) providing an electrical connection running vertically through at least one of the electrically insulating layers 30a and/or 30b. Further, the insulating laminate structure 30 may include at least one electrically conducting layer (not shown) embedded between the first and the second electrically insulating layers 30a, 30b of the insulating laminate structure.

Figure 2B:
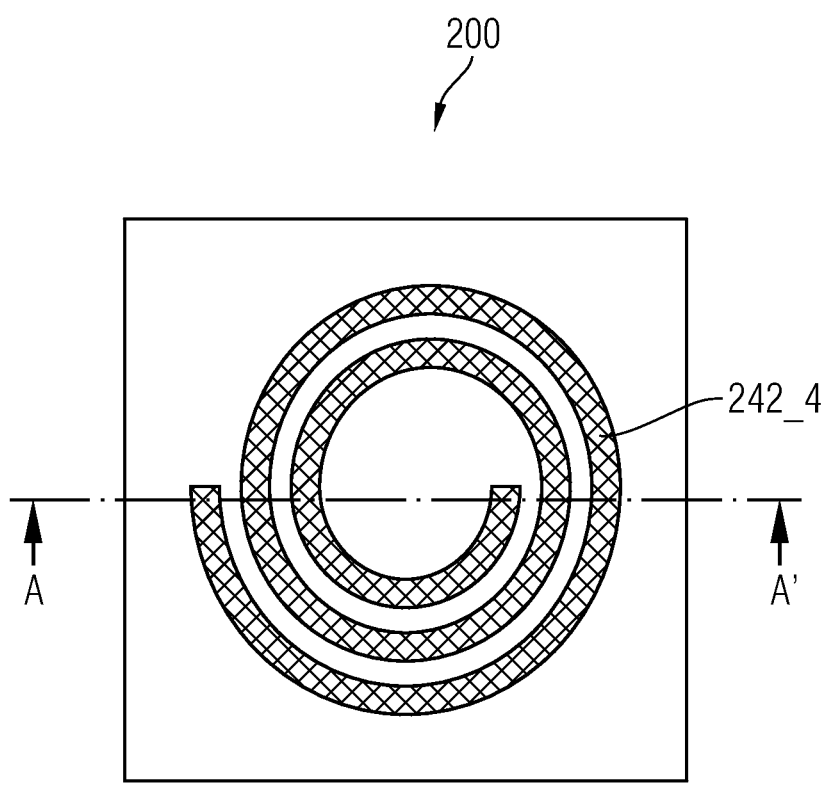
FIG. 2B schematically illustrates a top view of a section of the chip package of FIG. 2A.

FIG. 2A shows a cross-sectional view of an exemplary implementation of a chip package 200, and FIG. 2B shows a plan view of a surface section of an insulating laminate structure at the bottom side of the chip package 200. Without saying, the techniques, layers, materials and methods described above may also be applied to the implementation explained further below in FIGS. 2A and 2B.

The chip package 200 comprises an electrically conducting chip carrier 210. The chip carrier 210 may have a plurality of parts, e.g. a first chip carrier part 210_1, a second chip carrier part 210_2, and a third chip carrier part 210_3, etc. In one embodiment the chip carrier 210 may be a leadframe.

The chip package 200 may be a multichip package comprising at least two chips, e.g. one logic chip and one power chip. By way of example, as shown in FIG. 2A, the chip package 200 may comprise a first semiconductor chip 220, a second semiconductor chip 222, and, e.g., a third semiconductor chip 224. The three semiconductor chips 220, 222, and 224 may be attached to the bottom side of the electrically conducting chip carrier 210. In one embodiment, the first and second semiconductor chips 220 and 222 may be mounted on the first chip carrier part 210_1 and the third semiconductor chip 224 may be mounted on the second chip carrier part 210_2. In another embodiment, the semiconductor chips 220, 222, and 224 may be mounted on the top side of the chip carrier 210 and/or may be mounted on other parts as illustrated in FIG. 2A of the chip carrier 210.

By way of example, the first semiconductor chip 220 may be a logic chip with, e.g., a non-vertical chip structure. A non-vertical chip structure may comprise an active main surface of the semiconductor chip including e.g. contact pads of the semiconductor chip and a passive main surface being electrically insulating. In one embodiment, the logic chip may be mounted on the first chip carrier part 210_1 with the passive main surface facing towards the chip carrier 210. The second and third semiconductor chips 222 and 224 may e.g. be power chips having, e.g., a vertical chip structure. Thus, byway of example, the drain electrode pads (not shown in the figure) of the semiconductor chips 222 and 224 may be mechanically mounted and electrically coupled to the chip carrier parts 210_1 and 210_2, respectively. The opposite surfaces of the power chips, which face away from the chip carrier 210, may provide contact pads for the source electrode (not shown) and the gate electrode (not shown), respectively.

The chip package 200 further comprises an insulating laminate structure 230. The insulating laminate structure 230 may embed the chip carrier 210 and the semiconductor chips 220, 222, 224 mounted thereon in the same way and to the same extent as described above with respect to FIGS. 1A and 1B. That is, in one embodiment, the insulating laminate structure 230 may comprise a first electrically insulating layer 230a mounted on the bottom side of the chip carrier 210 with the semiconductor chips 220, 222, 224 mounted thereon, optionally a second electrically insulating layer 230b mounted on the topside of the chip carrier 210, and optionally a third electrically insulating layer 230c attached to the bottom side of the first electrically insulating layer 230a.

The second electrically insulating layer 230b can be omitted. In this case, which corresponds to the implementation of the chip package of FIG. 1A, the top sides of one or more of the chip carrier parts 210_1, 210_2 and/or 210_3 may remain exposed and could be used as external terminals configured to be mounted on a heat sink or on an application board.

Furthermore, the chip package 200 may, e.g., comprise a first structured electrically conducting layer 242, a second structured electrically conducting layer 244, and a third structured electrically conducting layer 240. The third structured electrically conducting layer 240 may be embedded between two electrically insulating layers of the insulating laminate structure 230, e.g. between layers 230a and 230c. The first structured electrically conducting layer 242 may be applied to the bottom side surface of the insulating laminate structure 230. The second structured electrically conducting layer 244 may be applied to the top side surface of the insulating laminate structure 230.

The first structured electrically conducting layer 242 may comprise a first section 242_1 and a second section 242_2. The second structured electrically conducting layer 244 may also comprise a first section 242_1 and a second section 242_2. Further, the third structured electrically conducting layer 240 may comprise a first section 240_1 and a second section 240_2.

The third structured electrically conducting layer 240 may serve as an electrical redistribution structure interconnecting between electrode pads of the semiconductor chips 220, 222, 224 and/or the chip carrier parts 210_1, 210_2, 210_3 and the first structured electrically conducting layer 242 arranged at the bottom surface of the laminate structure 230. For example if such an electrical redistribution structure is not needed, the third electrically insulating layer 230c can be omitted. In this case, the first structured electrically conducting layer 242 is arranged on the bottom surface of the first electrically insulating layer 230a.

The insulating laminate structure 230 of the chip package 200 may comprise at least one via or through-connection 250. The at least one through-connection 250 may provide an electrical connection through one or more electrically insulating layers of the insulating laminate structure 230, e.g. through layers 230a, 230b, and/or 230c. By way of example, the bottom side of the chip carrier 230 and/or contact pads of the semiconductor chips 220, 222, 224 may be electrically coupled by a through-connection 250 to the third structured electrically conducting layer 240 or to the first structured electrically conducting layer 242. The first structured electrically conducting layer 242 may be electrically coupled to the second structured electrically conducting layer 244 and/or to the third structured electrically conducting layer 240 by a through-connection 250. The second structured electrically conducting layer 244 may e.g. also be electrically coupled to the top side of the chip carrier 210 by a through-connection 250.

As mentioned above, there may be various techniques for applying a structured electrically conducting layer 240, 242, 244. In one embodiment an electrically conducting layer such as, e.g., a metal foil may already be attached to the electrically insulating layers 230a, 230b, or 230c of the insulating laminate structure 230 before being laminated and structured. In another embodiment an electrically conducting layer may be applied to the electrically insulating layer 230a, 230b, or 230c by using, for example, a sputtering technique, a galvanic deposition technique, or an electroless plating technique. As mentioned above, the electrically conducting layer may be structured by applying, e.g., etching techniques.

As illustrated in FIG. 2A, the first section 240_1 of the third structured electrically conducting layer 240, the first section 242_1 of the first structured electrically conducting layer 242 and the through-connections 250 may be configured to provide electrical coupling between components of the chip package 200 such as, e.g., the parts of the electrically conducting chip carrier 210 or the semiconductor chips 220, 222, or 224. By way of example, the first semiconductor chip 220 may be electrically coupled to the second semiconductor chip 222 and, not shown in the cross-sectional view of FIG. 2A, the first semiconductor chip 220 may also be coupled to the third semiconductor chip 224. In one embodiment, the first semiconductor chip 220 may be a logic chip, which may electrically control the second and third semiconductor chips 222 and 224. The semiconductor chips 222 and 224 may power chips and the contact pads (not shown), which may electrically be coupled to the first semiconductor chip 220, may be the gate electrodes of the MOSFET chips. Furthermore, a contact pad of the second semiconductor chip 222 may be electrically coupled to the second chip carrier part 210_2 and a contact pad of the third semiconductor chip 224 may be electrically coupled to the third chip carrier part 210_3. By way of example, the second and third semiconductor chips 222 and 224 may be power chips and the contact pads of the second semiconductor chip 222 and the third semiconductor chip 224, which may be electrically coupled to the second and third chip carrier parts 210_2 and 210_3, respectively, may be the drain electrodes of the power chips. The source electrode of the second semiconductor chip 222 may be electrically coupled to the second chip carrier 210_2 and thus to the drain electrode of the third semiconductor chip 224. That way, the chip package 200 may implement a half-bridge circuitry, whereby the first semiconductor chip 220 may serve as a gate driver circuitry.

As illustrated in FIG. 2A the first section 244_1 of the second structured electrically conducting layer 244 may be configured as external contact pads (i.e. external terminals) of the chip package 200. The first section 244_1 may e.g. comprise a first external contact pad electrically coupled to the first chip carrier part 210_1, a second external contact pad electrically coupled to the second chip carrier part 210_2, and a third external contact pad electrically coupled to the third chip carrier part 210_3. The first section 244_1 of the second structured electrically conducting layer 244 may be reinforced by a metal layer on top, such as a copper layer, for e.g. soldering of the external contact pads to an application board. That is, the structured first section 244_1 of the second electrically conducting layer 244 may define the footprint of the chip package 200.

The second section 242_2 of the first electrically conducting layer 242 is configured as a passive electronic device or a part thereof. The passive device may be an inductor. In this case, the second section 242_2 of the first electrically conducting layer 242 may be configured as a first coil implemented by one or more spiralic-like windings of electrical conducting traces. By way of example, the cross-sectional view of FIG. 2A (which is along line A-A' of FIG. 2B) shows six electrical traces in the second section 242_2 of the second electrically conducting layer 242 which may implement a first coil having e.g. 2.5 windings (see FIG. 2B). The inductance of the first coil may be set by the number of the windings of the electrical traces, by the radius of the windings, and/or by the material composition of the insulating laminate structure 230 which may provide for a magnetic core material. For example, the inductance of the first coil may be configured to be in the range from 100 µH to 100 nH, and, more particularly, in the range from 1 µH to 10 nH.

In one embodiment, the second section 242_2 of the first structured electrically conducting layer 242 (i.e. the first coil) may be located in an area of the surface of the bottom side of the insulating laminate structure 230 which is not vertically above or beneath a part of the chip carrier 210. The second section 242_2 of the first structured electrically conducting layer 242 may e.g. be electrically coupled to the first semiconductor chip 220 by the second section 240_2 of the third electrically conducting layer 240 and by at least one through-connection 250.

A second section 244_2 of the second structured electrically conducting layer 244 may likewise be configured as the passive electronic device or as a part thereof. The second section 244_2 may, e.g., be configured as a second coil. By way of example, the inductance of the second coil may be set by the number of the windings of the electrical traces, by the radius of the windings, and/or by the material composition of the insulating laminate structure 230, which may comprise a magnetic core material. For example, the inductance of the second coil may be in the range from 100 µH to 100 nH, and more particularly in the range from 1 µH to 10 nH. The chip package 200 may e.g. comprise the first coil or the second coil or the first and second coil.

The second coil may be electrically coupled by a through-connection 250 to the first coil. Alternatively, the second coil may be inductively coupled to first coil. In one embodiment, the second coil may be located in an area of the surface of the top side of the insulating laminate structure 230 which is not vertically above or beneath a part of the chip carrier 210. In particular, the first and the second coils may be aligned to one another in a direction normal to the insulating laminate structure 230.

The chip package 200 may optionally comprise an electrical insulating layer 270 applied to the bottom side of the insulating laminate structure 230 and the first structured electrically conducting layer 242. For instance, the electrical insulating layer 270 may be applied by a laminate method, or by any other appropriate method. The electrical insulating layer 270 may partly or completely cover the first structured electrically conducting layer 242 (e.g. the first coil). The electrical insulating layer 270 may serve as a protection layer in order to prevent possible damage of the first coil by environmental attack, e.g. by mechanical, chemical or other type impact.

Figure 3:
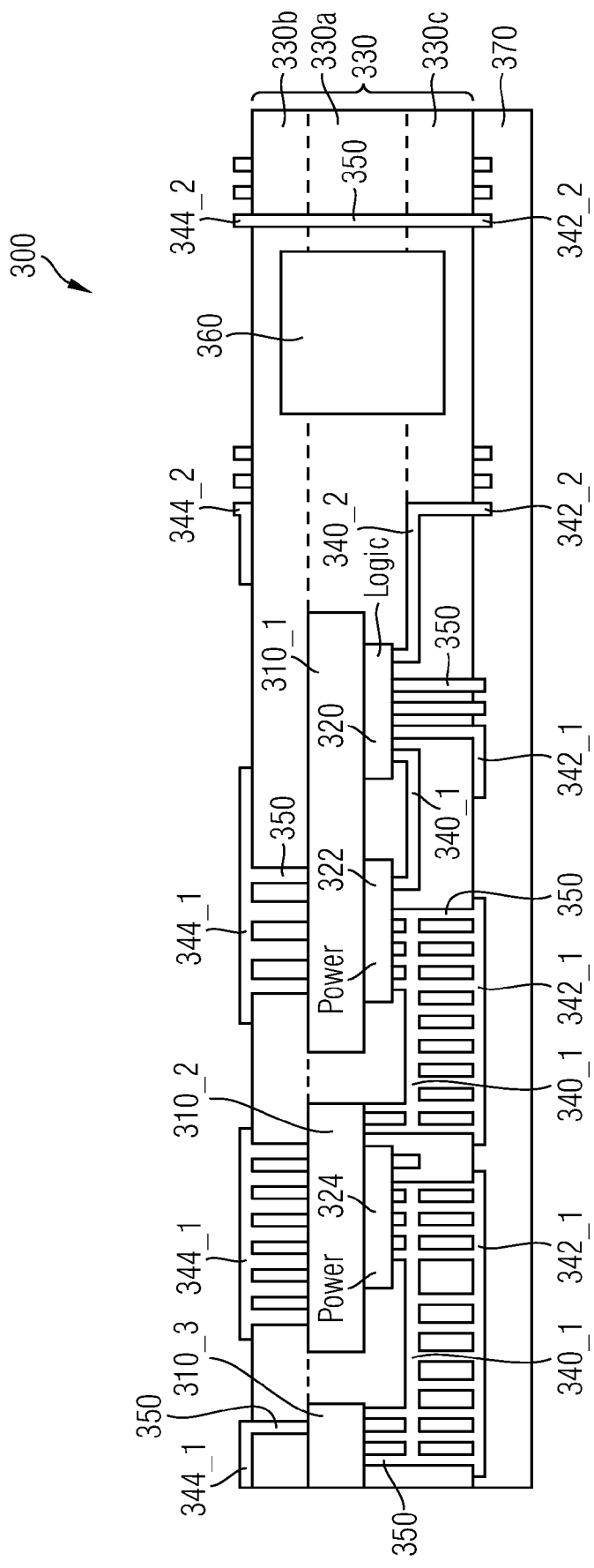
FIG. 3 schematically illustrates a cross-sectional view of an embodiment of a chip package comprising two coils and a magnetic core.

FIG. 3 shows an exemplary chip package 300 comprising an inductor as a passive device. The chip package 300 may comprise an electrically conducting chip carrier 310, which may comprise a first chip carrier part 310_1, a second chip carrier part 310_2, and a third chip carrier part 310_3. The chip package 300 may further comprise a first semiconductor chip 320, a second chip semiconductor chip 322, and a third semiconductor chip 324. The semiconductor chips 320, 322, and 324 may be mounted on the bottom surface of the chip carrier 310. An insulating laminate structure 330 may embed the chip carrier 310 and the semiconductor chips 320, 322, and 324 mounted thereon. At least one electrical through-connection 350 may provide electrical coupling through electrically insulating layers of the insulating laminate structure 330. Furthermore, a first structured electrically conducting layer 342 comprising a first section 342_1, a second section 342_2, a second structured electrically layer 344 comprising a first section 344_1 and a second section 344_2 and a third structured electrically conducting layer 340 comprising a first section 340_1 and second section 340_2 may be included.

The second section 342_2 of the first structured electrically conducting layer 342 may be configured as the first coil and the second section 344_2 of the second structured electrically conducting layer 344 may be configured as the second coil. Furthermore, an electrically insulating layer 370 may be applied to the bottom side of the insulating laminate structure 330.

The insulating laminate structure 330 may comprise a first electrically insulating layer 330a mounted on the bottom side of the chip carrier 310 with the semiconductor chips 320, 322, 324 mounted thereon. Optionally a second electrically insulating layer 330b may be mounted on the top side of the chip carrier 310, and, optionally, a third electrically insulating layer 330c may be attached to the bottom side of the first electrically insulating layer 330a. The features and arrangements of aforementioned components of the chip package 300, which are also included in the chip package 200, may be identical or similar as for the chip package 200. Therefore, in order to avoid reiteration, reference is made to the description above in view of these components.

In one embodiment as exemplarily illustrated in FIG. 3 for the chip package 300, the first coil and the second coil may be inductively coupled to a magnetic core 360. The magnetic core 360 may be laterally spaced apart from the electrically conducting chip carrier 310 and/or may pass through a plane defined by a main surface of the electrically conducting chip carrier 310. The magnetic core 360 may pass through the first electrically insulating layer 330a. It may, e.g., also enter at least partially into the second electrically insulating layer 330b and/or into the third electrically insulating layer 330c.

The material of the magnetic core 360 may be selected from a high-µ material, which is a material having a high (relative) magnetic permeability, such as iron, iron alloys, ferrites, permalloy, metal, nanoperm, or any other appropriate material. The high-µ material may, e.g., be a paramagnetic material or a ferromagnetic material. In one embodiment the magnetic core 360 may comprise a stack of at least one layer of high-µ material.

The magnetic core 360 may be completely pre-manufactured before applying it to the insulating laminate structure 330. There may be different techniques embedding the magnetic core 360 into the insulating laminate structure 330. In one embodiment, there may be generated an opening into the insulating laminate structure 330 by, for example, by stamping, conventional or laser drilling, or etching methods. The magnetic core 360 may be inserted into the opening. An electrically insulating layer (e.g. electrically insulating layers 330c and/or 330b) may be laminated onto the magnetic core 360 embedding the magnetic core 360 completely in the insulating laminate structure 330.

Figure 4:
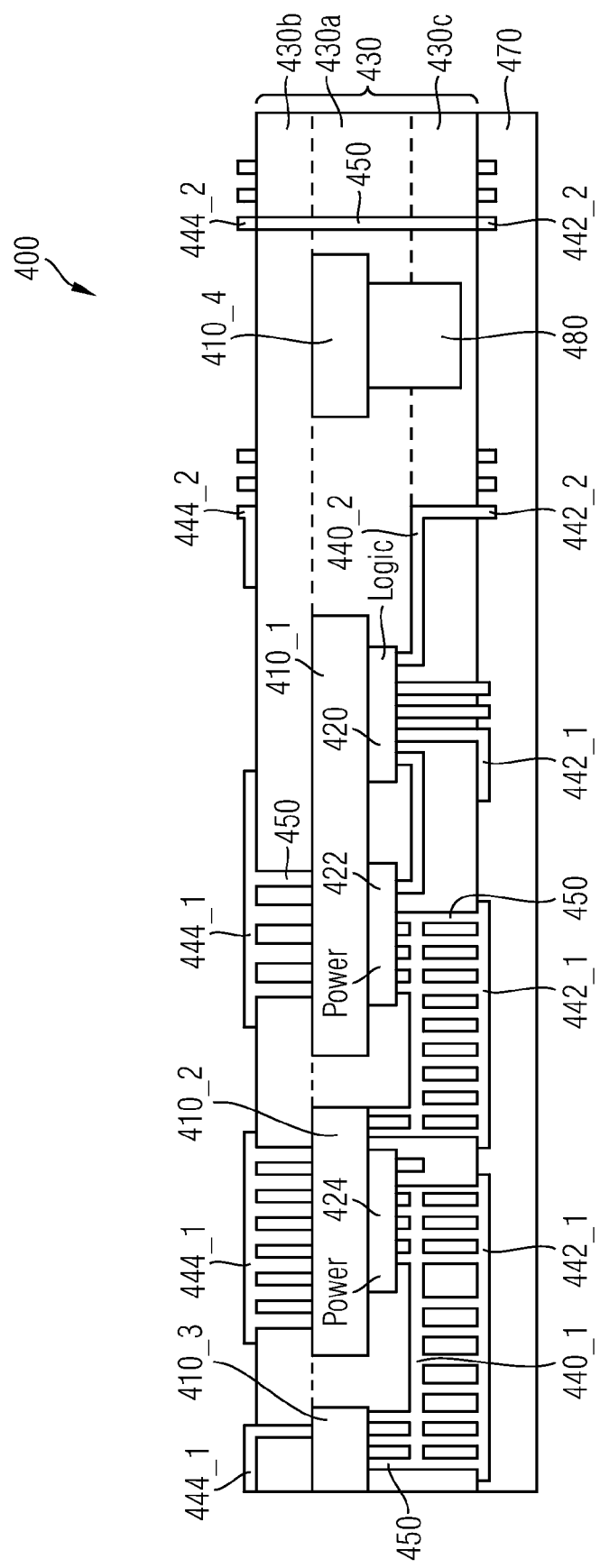
FIG. 4 schematically illustrates a cross-sectional view of an embodiment of a chip package comprising two layer-integrated coils and a magnetic core being attached to a separate part of a chip carrier.

FIG. 4 illustrates an exemplary chip package 400 comprising an inductor as a passive device. The chip package 400 may comprise an electrically conducting chip carrier 410 (e.g. leadframe), which may comprise a first chip carrier part 410_1, a second chip carrier part 410_2, a third chip carrier part 410_3, and a fourth carrier part 410_4. The chip package 400 may further comprise a first semiconductor chip 420, a second chip semiconductor chip 422, and a third semiconductor chip 424. The semiconductor chips 420, 422, and 424 may be mounted on the bottom surface of the chip carrier parts 410_1 and 410_2. Furthermore, the fourth carrier part 410_4 may be used as a carrier for a magnetic core 480, which may e.g. be mounted to the bottom surface of the fourth carrier part 410_4. The magnetic core 480 may, for example, be a metal core or a high-µ core, and reference is made to the description above to avoid reiteration. The magnetic core 480 may further comprise at least one layer or sheet of a magnetic core material. In one embodiment, the magnetic core 480 may be attached to the bottom surface of the fourth carrier part 410_4 by similar methods as used for attaching semiconductor chips, such as, e.g., chip bonding techniques. In another embodiment, the magnetic core 480 may be attached to the fourth carrier part 410_2 by similar methods as used for generating an electrically conducting layer on an insulating laminate structure such as, e.g., galvanic or electroless plating, chemical vapor deposition, etc.

The chip package 400 may further comprise an insulating laminate structure 430 including, e.g., electrically insulating layers 430a, 430b, 430c and embedding the chip carrier 410 and the semiconductor chips 420, 422, and 424 mounted thereon. At least one electrical through-connection 450 may provide electrical coupling through electrically insulating layers of the insulating laminate structure 430. Furthermore, a first structured electrically conducting layer 442 comprising a first section 442_1 and a second section 442_2, e.g. a second structured electrically layer 444 comprising a first section 444_1 and a second section 444_2 and, e.g., a third structured electrically conducting layer 440 comprising a first section 440_1 and second section 440_2 may be included. The second section 442_2 of the first structured electrically conducting layer 442 may be configured as the first coil and the second section 444_2 of the second structured electrically conducting layer 444 may be configured as the second coil. The first coil may be electrically coupled to the second coil by e.g. the electrical through-connection 450 or by inductance coupling. Furthermore, an electrically insulating layer 470 may be applied to the bottom side of the insulating laminate structure 430. The features and arrangements of components of the chip package 400, which are also included in the chip package 200 or 300 may be similar as for the chip package 200 or 300.

Figure 5:
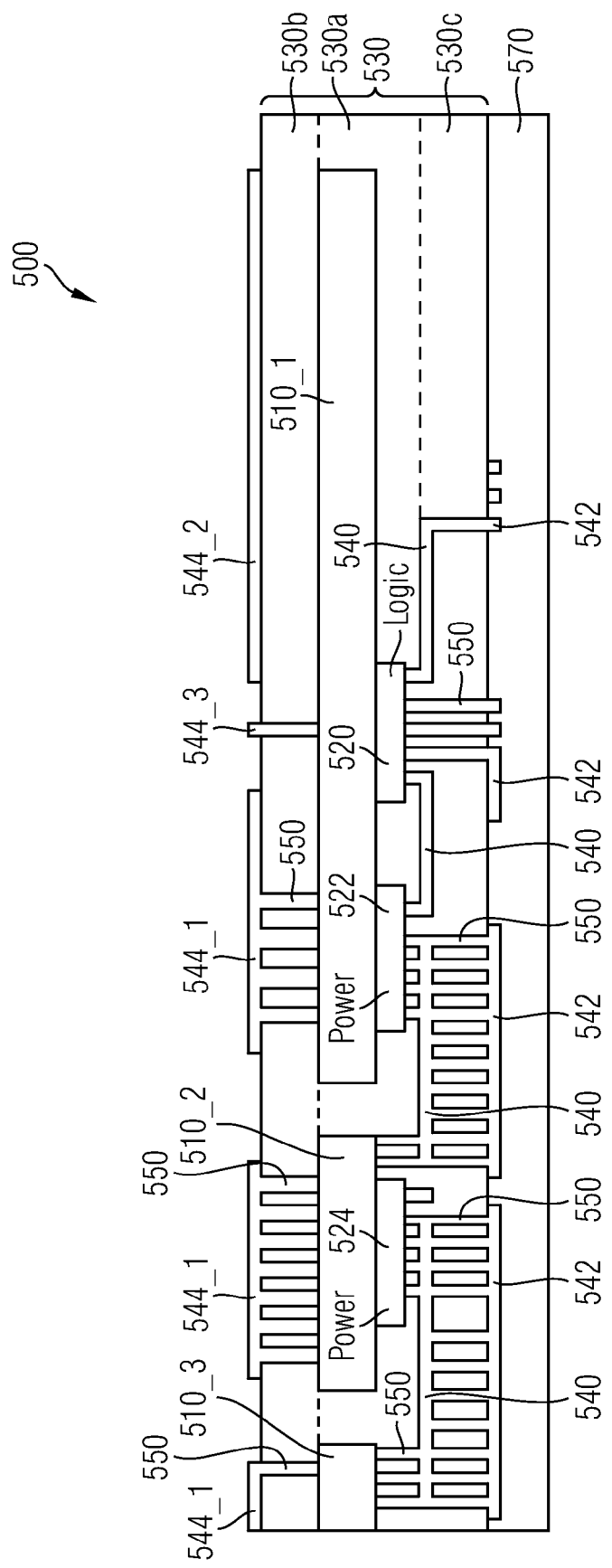
FIG. 5 schematically illustrates a cross-sectional view of an embodiment of a chip package comprising a capacitor.

An exemplary chip package 500 comprising a capacitor as a passive device is illustrated in FIG. 5. The chip package 500 may comprise an electrically conducting chip carrier 510, wherein the chip carrier 510 may comprise a first chip carrier part 510_1, a second chip carrier part 510_2, and a third chip carrier part 510_3. The chip package 500 may further comprise a first semiconductor chip 520, which may be mounted on the first chip carrier part 510_1, a second semiconductor chip 522, which may also be mounted on the first chip carrier part 510_1, and a third semiconductor chip 524, which may be mounted on the second chip carrier part 510_2. The semiconductor chips 520, 522, and 524 may e.g. be mounted on to the bottom side of the chip carrier 510. The chip package 500 may further comprise an insulating laminate structure 530 including, e.g., first, second and third electrically insulating layer layers 530a, 530b, 530c and embedding the chip carrier 510 and the semiconductor chips 520, 522, and 524. The optional third structured electrically conducting layer 540 may e.g. be embedded between the electrically insulating laminate layers 530a and 530c of the insulating laminate structure 530. A first structured electrically conducting layer 542 may be applied to the bottom side of the insulating laminate structure 530. Furthermore, an electrically insulating layer 570 may be attached to the bottom side of the insulating laminate structure 530 and may cover the structured electrically conducting layer 542 thereon. The chip package 500 may further comprises at least one through-connection 550 providing electrical coupling through an electrical insulating laminate layer, e.g. first, second and third electrically insulating layer layers 530a or 530b or 530c. The features and arrangement of the components of the chip package 500 may be similar to the previous embodiments, and reference is made to the above description in order to avoid reiteration.

The chip package 500 may further comprise a second structured electrically conducting layer 544 applied to the top side of the insulating laminate structure 530. The second structured electrically conducting layer 544 may comprise a first section 544_1, a second section 544_2, and a third section 544_3. The first section 544_1 may provide contact pads (external terminals) of the chip package 500. In one embodiment the first section 544_1 may be reinforced by, e.g., a copper layer. For example, the first sections 544_1 may define the footprint of the chip package 500.

As illustrated in FIG. 5, the chip package 500 may further comprise a second section 544_2 and a third section 544_3 of the second structured electrically conducting layer 544. In one embodiment, the second section 544_2 may form a part of the passive device. The passive device may be a capacitor, and the second section 544_2 may form a first plate of the capacitor. A second plate of the capacitor may e.g. be formed by the first part 510_1 of the electrically conducting chip carrier 510. The third section 544_3 of the third structured electrically conducting layer 544 may be coupled to the second plate of the capacitor and may, e.g., form a contact pad (external terminal) of the chip package 500. The capacity of the capacitor may be set by the thickness and the dielectric material of the insulating laminate structure 530 (or, in the implementation shown in FIG. 5, by the thickness and the dielectric material of the second electrically insulating layer 530b) located in between the first plate and the second plate, and is further effected by the lateral dimensions the first plate of the capacitor and the second plate of the capacitor. For example, in this and the other implementations herein, the capacity of the capacitor may be in the range from 100 µF to 100 nF, and, more particularly, may be in the range from 1 µF to 10 nF.

Figure 6:
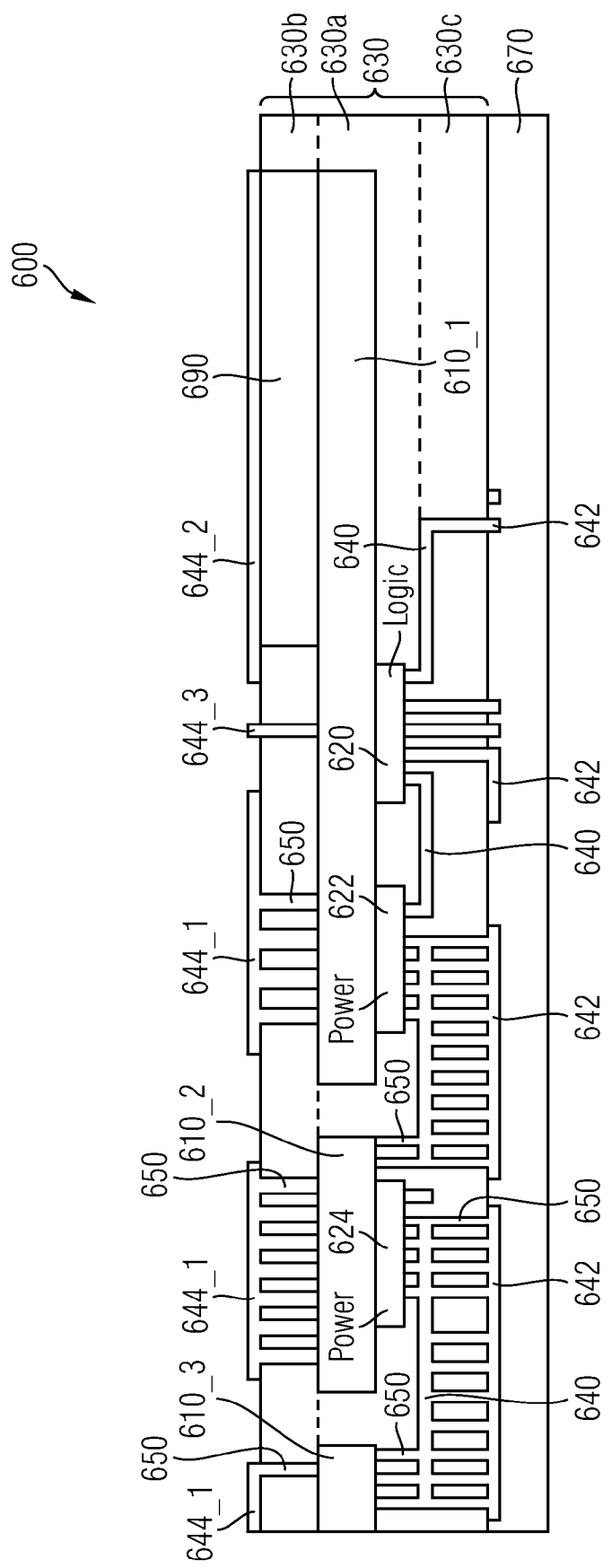
FIG. 6 schematically illustrates a cross-sectional view of an embodiment of a chip package comprising a capacitor and high-$\in$ dielectric.

An exemplary chip package 600 comprising a capacitor as a passive device is illustrated in FIG. 6. The chip package 600 may comprise an electrical conducting chip carrier 610, which may include a first chip carrier part 610_1, a second chip carrier part 610_2, and a third chip carrier part 610_3. The chip package 600 may further comprise one or more semiconductor chips, e.g. a first semiconductor chip 620, a second semiconductor chip 622, and a third semiconductor chip 624. An insulating laminate structure 630 including, e.g., first, second and third electrically insulating layers 630a, 630b, 630c may embed the chip carrier 610 and the semiconductor chips 620, 622, and 624 being mounted thereon. The chip package 600 may further comprise a first structured electrically conducting layer 642, a second structured electrically conducting layer 644, and a third structured electrically conducting layer 640. The second structured electrically conducting layer 644 may e.g. include a first section 644_1, a second section 644_2, and a third section 644_3. Furthermore, at least one through-connection 650 may provide electrical coupling through an electrically insulating layer of the insulating laminate structure 630. And, an electrically insulating layer 670 may e.g. be applied to the bottom side of the insulating laminate structure 630 and may cover the first structured electrically conducting layer 642 applied thereon. The components of the chip package 600 may be implemented the same way as described earlier, and reference is made to the description herein, in particular to the description of FIG. 5 illustrating a chip package 500.

A first plate of the capacitor may be formed by the second section 644_2 of the second structured electrically conducting layer 644 as is described to FIG. 5. Furthermore, a second plate of the capacitor may be provided by the first chip carrier part 610_1. The first chip carrier part 610_1 may be coupled to the third section 644_3, which may, e.g., form a contact pad (external terminal) of the chip package 600.

A dielectric layer 690 may be applied between the first plate and the second plate of the capacitor. The dielectric layer 690 may be a material having a high (relative) electric permittivity ∈ (or "k" as often referred to the relative permittivity). Such materials are referred to as high-∈ dielectric or high-k dielectric in the art. For instance, the high-∈ dielectric may be selected from the group of, e.g., hafnium silicate, hafnium dioxide, zirconium silicate, and zirconium dioxide. There may be different techniques embedding the dielectric layer 690 into the insulating laminate structure 630. By way of example, before the second structured electrically conducting layer 644 is applied to the top side of the insulating laminate structure 630 there may be generated an opening into the insulating laminate structure 630 from the top side. The opening may be filled with a high-∈ dielectric material and the structured electrically conducting layer 644_2 may be applied on to the high-∈ dielectric layer 690. The opening may be generated by stamping, conventional or laser drilling, or etching methods. The high-∈ dielectric layer 690 may, for example, be applied to the opening by chemical vapor deposition.

In another method, the dielectric layer 690 may be applied directly onto the first chip carrier part 610_1 before the insulating laminate structure 630 (or, in the implementation shown in FIG. 6, the second electrically insulating layer 630b thereof) is applied to the chip carrier 610. Thus, it may also be possible that the dielectric layer 690 is pre-manufactured and may be applied to the chip carrier 610 with a similar technique as the semiconductor chips 620, 622, and 624 may be applied to the chip carrier, e.g. by gluing. The thickness of the dielectric layer 690 may, e.g., be equal to the thickness of the second electrically insulating layer 630b covering the top side of the chip carrier 610.

Figure 7:
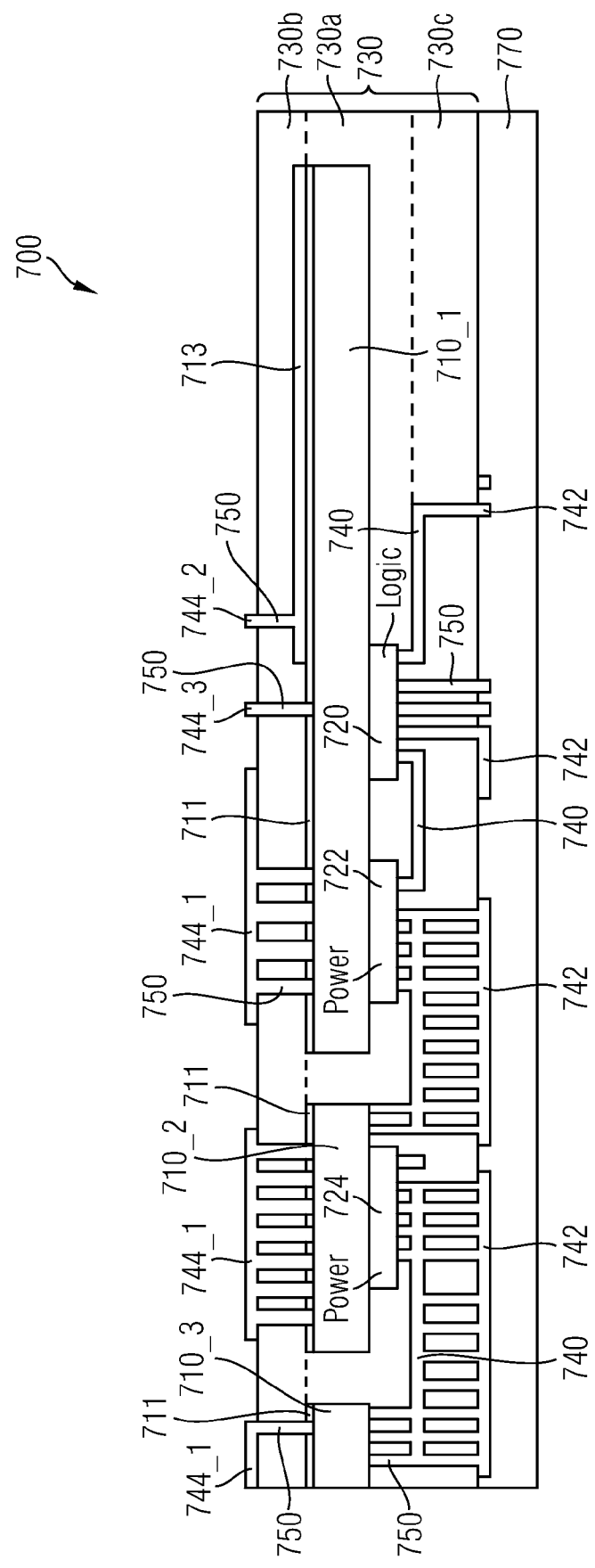
FIG. 7 schematically illustrates a cross-sectional view of an embodiment of a chip package comprising a capacitor mounted on the chip carrier.

A further exemplary chip package 700 is illustrated in FIG. 7. The chip package 700 may comprise an electrically conducting chip carrier 710. The electrically conducting chip carrier 710 may have a first chip carrier part 710_1, a second chip carrier part 710_2, and a third chip carrier part 710_3. An insulating laminate structure 730 including, e.g., first, second and third electrically insulating layers 730a, 730b, 730c may embed the chip carrier 710 and semiconductor chips 720, 722, and 724 being mounted thereon. Reference is made to the above description of corresponding parts to avoid reiteration.

A first electrical functional layer 711 may be attached to the top side of the electrically conducting chip carrier 710. In another embodiment the electrical functional layer 711 may be applied to the bottom side of the chip carrier 710, or the electrical functional layer 711 be applied to the top and bottom sides of the chip carrier 711. The electrical functional layer 711 may be layer selected from an electrical functional material, such as high-∈ dielectric material, high-µ material, or an electrically conducting material having a well-defined electrical resistance. In one embodiment, the electrical functional layer 711 may be a stack of layers with different materials.

In the exemplary chip package 700, the chip package 700 may comprise a capacitor as a passive device and the first electrical functional layer 711 may be a high-∈ dielectric layer. The electrical functional layer 711 may be applied, e.g., by a lamination method, by a chemical vapor deposition method or by any other appropriate method. The electrical functional layer 711 may be structured before or after being applied to the chip carrier 710.

The chip package 700 may further comprise a first structured electrically conducting layer 713 applied to the electrical functional layer 711. As illustrated in FIG. 7, the first structured electrically conducting layer 713 may have a pad-like structure. The electrically conducting layer 713 may be configured as a first plate of a capacitor. The first plate of the capacitor may e.g. be covered by the second electrically insulating layer 730b. The first plate of the capacitor may be capacitively coupled by the electrical functional layer 711 to the first chip carrier part 710_1. The first chip carrier part 710_1 may form the second plate of the capacitor. The capacity of the capacitor may depend on the dielectric material of the electrical functional layer 711, the thickness of the electrical functional layer 711, and the sizes of the first and second plates of the capacitor. The thickness of the electrical functional layer 711 may be less than the thickness of the second electrically insulating layer 730b, e.g. less than 0.5 of the thickness of the second electrically insulating layer 730b. For example, the capacity of the capacitor may be in the range from 100 µF to 100 nF, and more particularly to be in the range from 1 µF to 10 nF.

The chip package 700 may further comprise a first structured electrically conducting layer 742 applied to the bottom side of the insulating laminate structure 730, a second structured electrically conducting layer 744 applied to the top side of the insulating laminate structure 730 and a third structured electrically conducting layer 740 embedded between two electrically insulating layers (e.g. layers 730a, 730c) of the insulating laminate structure 730. Again, the second structured electrically conducting layer 744 may include a first section 744_1, a second section 744_2, and a third section 744_3. As illustrated in FIG. 7, the second section 744_2 may be electrically coupled to the electrically conducting layer 713 and may provide a contact pad (external terminal) of the chip package 700. The third section 744_3 may be electrically coupled to the first chip carrier part 710_1 by a through-connection 750 providing electrical contact through e.g. the electrically insulating layer 730b and through the electrical functional layer 711. The third section 744_3 may also provide a contact pad (external terminal) of the chip package 700. The second section 744_2 and the third section 744_3 of the layer 744, which may also provide for contact pads (external terminals) of the chip package 700, may further provide electrical coupling to other components of the chip package 700, such as, e.g., the second chip carrier part 710_2, the third chip carrier part 710_3, or to the semiconductor chips 720, 722, or 724. Furthermore, the chip package 700 may optionally comprise an electrical insulating layer 770 applied to the bottom side of the insulating laminate structure 730.

Figure 8:
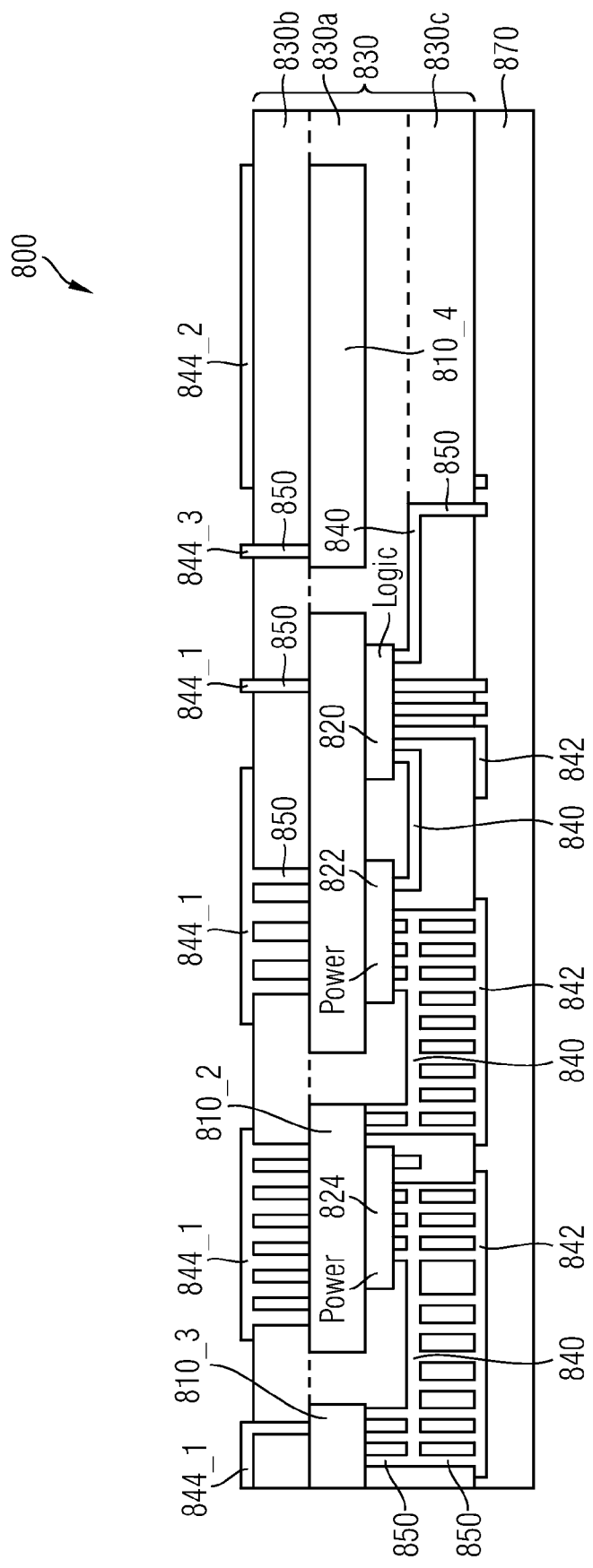
FIG. 8 schematically illustrates a cross-sectional view of an embodiment of a chip package comprising a capacitor mounted on a part of a carrier which is separate from the chip carrier.

A further exemplary chip package 800 containing a capacitor as a passive device is illustrated in FIG. 8. The chip package 800 may comprise an electrically conducting chip carrier 810, wherein the chip carrier 810 may include a first chip carrier part 810_1, a second chip carrier part 810_2, a third chip carrier part 810_3, and a fourth carrier part 810_4. Similar to the detailed description of FIG. 5, a first semiconductor chip 820, a second semiconductor chip 822, and a third semiconductor chip 824 may be applied to the bottom side of the electrically conducting chip carrier 810. The chip package 800 may further comprise an insulating laminate structure 830 including, e.g., first, second and third electrically insulating layers 830a, 830b, 830c. The insulating laminate structure 830 may encapsulate the chip carrier 810 with the semiconductor chips 820, 822, and 824 being mounted thereon. The insulating laminate structure 830 may further comprise a third structured electrically conducting layer 840, which is applied between two electrically insulating layers (e.g. layers 830a, 830c) of the laminate structure 830 at the bottom side of the chip carrier 810. Furthermore, at least one through-connection 850 may be included by the insulating laminate structure 830. Furthermore, a second structured electrically conducting layer 842 may be applied at the bottom side of the insulating laminate structure 830. Furthermore, a second structured electrically conducting layer 844 may be applied to the top side of the insulating laminate structure 830, e.g. to the top side of layer 830b. The second structured electrically conducting layer 844 may comprise a plurality of sections, e.g. a first section 844_1, a second section 844_2, and a third section 844_3. The first sections 844_1 may be configured as external contact pads (external terminals) of the chip package 800. The second section 844_2 may be configured as a first plate of a capacitor. The structure of the first plate of the capacitor may be, for example, similar to a contact pad. The first plate of the capacitor may be capacitively coupled to a fourth carrier part 810_4 defining a second plate of the capacitor. Thus, different from chip packages 600 and 700, the fourth carrier part 810_4 which provides for the second capacitor plate does not serve as a chip carrier. The second plate of the capacitor may be provided by a separate part 810_4 of the carrier 810 (e.g. a leadframe), and this separate part 810_4 of the carrier 810 may, e.g., be exclusively used as a capacitor plate.

The third section 844_3 of the second structured electrically conducting layer 844 may be electrically coupled to the second plate of the capacitor and may form electrical traces or leads on the surface of the top side of the insulating laminate structure 830, e.g. layer 830b. Furthermore, the chip package 800 may comprise an electrical insulating layer 870 applied to the bottom side of the insulating laminate structure 830.

In the chip package 800, the dielectric layer 690 as described above could be used as a capacitor dielectric material in the same way as in chip package 600. Further, the concept of a separate part 810_4 of the carrier 810 which does not serve as a chip carrier and may, e.g., be exclusively used as a capacitor plate may also be implemented in chip packages 600 or 700.

Figure 9:
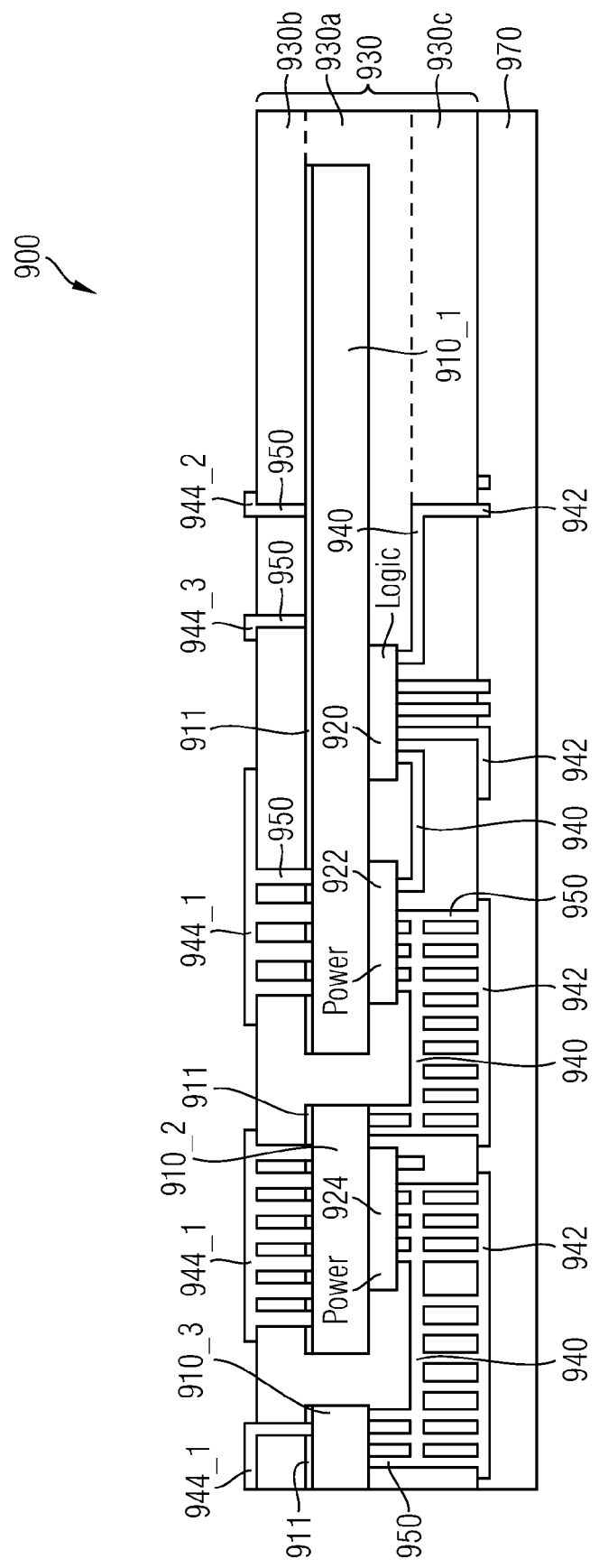
FIG. 9 schematically illustrates a cross-sectional view of an embodiment of a chip package comprising a resistor.

An exemplary chip package 900 containing a resistor as a passive device is illustrated in FIG. 9. The chip package 900 may comprise an electrically conducting chip carrier 910, wherein the electrically conducting chip carrier 910 may include a first chip carrier part 910_1, a second chip carrier part 910_2, and a third chip carrier part 910_3. Furthermore, the chip package 900 may comprise a first electrical functional layer 911 which is applied to the top side of the chip carrier 910. In one embodiment, the first electrical functional layer 911 may comprises one resistive layer. In another embodiment, the electrical functional layer 911 may comprise a first dielectric layer, which faces the electrically conducting chip carrier 910, and a second resistive layer, which may be electrically insulated from the chip carrier 910 by the first dielectric layer and which may have a well-defined electrical resistance. Furthermore in another embodiment, the electrical functional layer 911 may be applied to the bottom side of the chip carrier 910, or the electrical functional layer 911 may be applied to the top and the bottom side of the chip carrier 910.

The electrical functional layer 911 may, for example, be laminated onto the chip carrier 910 before the semiconductor chips are attached. The lamination process for the stack of at least one layer of the electrical functional layer 711 may be carried out for the whole stack or layer by layer of the stack. In another embodiment, the electrical functional layer 911 may be applied, for example, by using deposition techniques such as, e.g., sputtering, plating, molding, CVD, or any other appropriate techniques.

The chip package 900 may e.g. comprise a first semiconductor chip 920, a second semiconductor chip 922, and a third semiconductor chip 924. An insulating laminate structure 930 including, e.g., first, second and third electrically insulating layers 930a, 930b, 930c may embed the electrically conducting chip carrier 910, the electrical functional layer 911, and the semiconductor chips 920, 922, and 924. The insulating laminate structure 930 may further comprise a third structured electrically conducting layer 940, which may be embedded between two electrically insulating layers (e.g. layers 930a, 930c) of the insulating laminate structure 930 at the bottom side of the chip carrier 910. The insulating laminate structure 930 may further comprises at least one through-connection 950, which may provide electrical connection through any electrically insulating layers 930a, 930b, 930c of the insulating laminate structure 930. The chip package 900 may further comprise a first structured electrically conducting layer 942 which may be applied to the bottom side of the insulating laminate structure 930 and a second structured electrically conducting layer 944, which may e.g. be applied to the top side of the insulating laminate structure 930.

The second structured electrically conducting layer 944 may comprise a first section 944_1, a second section 944_2, and a third section 944_3. The first, second, and third sections 944_1, 944_2, 944_3 may be configured as external contact pads (external terminals) of the chip package 900. The second section 944_2 and the third section 944_3 of the third structured electrically conducting layer 944 may comprise electrical traces or contact pads which may be electrically coupled to the electrical functional layer 911 by electrical through-connections. By way of example, the through-connections coupling to the resistive layer may only couple to the resistive layer and not to the chip carrier 910. The second and third sections 944_2, 944_3 of the third structured electrically conducting layer may further comprise electrical leads or traces coupled to other components of the chip package 900. The chip package 900 may further comprise an electrical insulating layer 970 applied to the bottom side of the insulating laminate structure 930.

The resistance provided by the resistive layer of the electrical functional layer 911 between the two contact pads at the second section 944_2 and at the third section 944_3 of the third electrically conducting layer 944 may be effected by selecting the material of the resistive layer of the electrical functional layer 911. Furthermore, the resistance depends on dimensional quantities such as, e.g., the thickness, length, width etc. of the resistive layer between the taps formed by the through-connections 950. For example, the resistance may be in the range from 10Ω to 5000Ω, and more particularly in the range from 50Ω to 500 Ω.

The chip package 900 may also implement the concept illustrated in chip package 800, namely to provide the electrical functional layer 911 on a separate part of the carrier 910 which does not serve as a chip carrier. This separate part may, e.g., be exclusively used as a carrier for the electrical functional layer 911 or may serve as the electrical functional layer 911 by itself.

In all embodiments, the chip package may be configured as a half-bridge circuitry. The half-bridge circuitry may have at least one passive device (inductor, capacitor or resistor) which is implemented in accordance with the description herein.

The electrically conducting chip carrier 10, 210, 310, 410, 510, 610, 710, 810, 910 of a chip package mentioned before may have a thickness in the range of between 100 μm and 500 μm, and more particularly of around 250 μm.

Furthermore, the first electrically insulating layer 30a, 230a, 330a, 430a, 530a, 630a, 730a, 830a, 930a of the insulating laminate structure of a chip package mentioned before may have a thickness in the range of between 50 μm and 500 μm, and more particularly of around 100 μm. The second electrically insulating layer 30b, 230b, 330b, 430b, 530b, 630b, 730b, 830b, 930b of the insulating laminate structure of a chip package mentioned before may have a thickness in the range of between 20 μm and 200 μm, and more particularly of around 50 μm. The third electrically insulating layer 230c, 330c, 430c, 530c, 630c, 730c, 830c, 930c of the insulating laminate structure of a chip package mentioned before may have a thickness in the range of between 20 μm and 100 μm, and more particularly of around 45 μm.

Furthermore, the first, second or third structured electrically conducting layer 40, 242, 244, 240, 342, 344, 340, 442, 444, 440, 542, 544, 540, 642, 644, 640, 742, 744, 740, 842, 844, 840, 942, 944, 940 of the insulating laminate structure of a chip package mentioned before may have a thickness in the range of between 5 μm and 100 μm, and more particularly between 40 μm and 50 μm.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention may be limited only by the claims and the equivalents thereof.

What is claimed is:

1. A chip package, comprising:
an electrically conducting chip carrier;
at least one semiconductor chip attached to the electrically conducting chip carrier;
an insulating laminate structure embedding the electrically conducting chip carrier and the at least one semiconductor chip; and
an inductor comprising a first structured electrically conducting layer,
wherein the first structured electrically conducting layer extends in a first plane directly on a surface of the laminate structure,
wherein the inductor further comprises a second structured electrically conducting layer extending in a second plane,
wherein the first structured electrically conducting layer forms a first coil of the inductor, the second structured electrically conducting layer forms a second coil of the inductor, and the second coil is electrically coupled to the first coil,
wherein the electrically conducting chip carrier and the at least one semiconductor chip extend between the first plane and the second plane.

2. The chip package of claim 1, wherein the first structured electrically conducting layer is electrically coupled to a contact pad of the at least one semiconductor chip.

3. The chip package of claim 1, further comprising:
a magnetic core embedded in the insulating laminate structure.

4. The chip package of claim 3, wherein the magnetic core is attached to the electrically conducting chip carrier.

5. The chip package of claim 3, wherein the magnetic core passes through a plane coplanar with a main surface of the electrically conducting chip carrier.

6. The chip package of claim 3, wherein the magnetic core comprises a ferromagnetic material or a high magnetic permeability material.

7. The chip package of claim 1, wherein the at least one semiconductor chip comprises a logic chip and a power chip.

8. A chip package, comprising:
an electrically conducting chip carrier;
at least one semiconductor chip attached to the electrically conducting chip carrier;
an insulating layer extending over the electrically conducting chip carrier;
a capacitor comprising a first structured electrically conducting layer extending over the insulating layer and forming a first plate of the capacitor, the insulating layer, and the electrically conducting chip carrier forming a second plate of the capacitor; and
an insulating laminate structure embedding the electrically conducting chip carrier, the at least one semiconductor chip, and the capacitor.

9. The chip package of claim 8, wherein the first structured electrically conducting layer is electrically coupled to a contact pad of the at least one semiconductor chip.

10. The chip package of claim 8, wherein the insulating layer comprises a high electric permittivity dielectric material.

11. The chip package of claim 8, wherein the at least one semiconductor chip comprises a logic chip and a power chip.

* * * * *